United States Patent
Yamaguchi et al.

(10) Patent No.: US 6,997,993 B2
(45) Date of Patent: Feb. 14, 2006

(54) SUSCEPTOR SUPPORTING CONSTRUCTION

(75) Inventors: Kazuaki Yamaguchi, Nagoya (JP); Yoshinobu Goto, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 10/068,791

(22) Filed: Feb. 6, 2002

(65) Prior Publication Data

US 2002/0170679 A1 Nov. 21, 2002

(30) Foreign Application Priority Data

Feb. 9, 2001 (JP) .................................... 2001-033809

(51) Int. Cl.
H01L 21/00 (2006.01)
C23C 16/00 (2006.01)

(52) U.S. Cl. .................. 118/728; 118/725; 118/500; 361/234; 219/444.1; 219/544; 156/345.51; 156/345.52; 279/128

(58) Field of Classification Search ............ 118/728, 118/725, 500; 156/345.51, 345.52; 361/234; 279/128; 219/444.1, 544

See application file for complete search history.

(56) References Cited

U.S. PATENT DOCUMENTS 5,688,331 A * 11/1997 Aruga et al. ............... 118/725

6,423,949 B1 * 7/2002 Chen et al. ................ 219/444.1
2003/0183340 A1 10/2003 Yamaguchi et al. ........... 811/31
2003/0183341 A1 10/2003 Yamaguchi et al. ........... 811/30

FOREIGN PATENT DOCUMENTS

JP 8-73280 A 3/1996

* cited by examiner

Primary Examiner—P. Hassanzadel
Assistant Examiner—Ram N Kackar

(74) Attorney, Agent, or Firm—Burr & Brown

(57) ABSTRACT

A susceptor supporting construction has a susceptor for heating a member to be processed and a supporting member, in which an inner space is arranged, connected to the susceptor. A chamber having an opening is connected to the supporting member, the opening of the chamber is communicated with the inner space of the supporting member, and the inner space of the supporting member is sealed in an airtight manner with respect to an inner space of the chamber. The supporting member further has a tubular main portion, a diameter extending portion arranged at an end portion thereof to which the susceptor is faced, and one or more continuous round portions arranged between the main portion and the diameter extending portion, when viewed by an outer profile of a longitudinal section of the supporting member.

8 Claims, 6 Drawing Sheets

SUSCEPTOR SUPPORTING CONSTRUCTION

BACKGROUND OF THE INVENTION

1. Field of the Invention

The present invention relates to a susceptor supporting construction used for attaching a susceptor to a chamber.

2. Prior Art Statement

In a semiconductor manufacturing application and so on, as shown, for example, in FIG. 6, it is necessary to attach a ceramic susceptor 2 to an inner wall surface of a chamber 10. In order to achieve such an attachment, one end 21a of a tubular supporting member 21 made of ceramics is attached to a contacting surface (rear surface) 2b of the ceramic susceptor 2, and the other end 21c of the supporting member 21 is attached to an inner wall surface 10d of the chamber 10. The supporting member is formed by heat resistive ceramics such as alumina, aluminum nitride and so on. An inner space 6 of the supporting member 21 is communicated with an opening 10a of the chamber 10. A portion between the supporting member 21 and the chamber 10 is sealed in an airtight manner by using an O-ring 20. In this manner, a portion between the inner space 6 of the supporting member 21 and an inner space 5 of the chamber 10 can be sealed in an airtight manner, so that a gas in the inner space 5 of the chamber 10 is not leaked outside of the chamber 10. In the ceramic susceptor 2, for example, a resistant heating member 4 is embedded.

A temperature of a mount surface (heating surface) 2a of the ceramic susceptor 2 for mounting a semiconductor wafer 1 reaches to a temperature for example, not less than 400° C. and sometimes not less than 600° C. On the other hand, a sealing member made of rubber such as the O-ring 20 and so on is unendurable for high temperatures, and a heat-resistant temperature of the sealing member is normally about 200° C. Therefore, it is preferred to control a temperature near the O-ring 20 to be not more than 200° C. by cooling a portion near the O-ring 20 by means of a cooling flange 8 arranged in the chamber 10.

However, in this embodiment, a temperature of the ceramic susceptor 2 becomes high as mentioned above, and a temperature of the one end 21a of the supporting member 21 exceeds for example 400° C., while a temperature of the other end 21c of the supporting member 21 is cooled to not more than 200° C. In this case, a temperature gradient in an inner portion of the supporting member becomes not less than 200° C.

In order to improve a connection strength of the supporting member with respect to the susceptor and to arrange gas holes and through holes for passing a terminal or a thermocouple in a wall surface of the supporting member 21, it is necessary to make a thickness of the supporting member 21 more thicker so as to increase a contacting area of the supporting member 21 with respect to the susceptor. However, if the supporting member becomes thicker, a heat conduction amount propagated through the supporting member becomes larger due to a temperature gradient in the supporting member mentioned above. As a result, a cold spot is generated to the heating surface 2a by a heat conduction increase near the connecting portion (one end) 21a of the supporting member. Therefore, it is effective to make a main portion of the supporting member thin and to arrange a thick extending portion (flange portion) to the supporting member at which a side end portion of the susceptor is faced.

However, if such a thick flange portion is arranged to an end portion of the supporting member, in the case that the susceptor is heated to high temperatures, there is a tendency such that an inner stress concentrated at near the boundary between the main portion and the flange portion becomes excessive. Therefore, in order to prevent a failure of the supporting member, it is necessary to set an upper limit temperature of the susceptor.

SUMMARY OF THE INVENTION

An object of the present invention is to provide a susceptor supporting construction having a susceptor for heating a member to be processed and a supporting member, in which an inner space is arranged, connected to the a susceptor. A chamber having an opening is connected to the supporting member; and the opening of the chamber is in communication with the inner space of the supporting member; In this manner, the inner space of the supporting member is sealed in an airtight manner with respect to the inner space of the chamber, which can suppress a heat conducted from the susceptor to the support member and can reduce a stress concentrated to the susceptor when the susceptor becomes heated to a high temperature.

According to the invention, a susceptor supporting construction having a susceptor for heating a member to be processed and a supporting member, in which an inner space is arranged, are connected to one another. A chamber having an opening is connected to the supporting member, and the opening of the chamber is in communication with the inner space of the supporting member, and the inner space of the supporting member is sealed in an airtight manner with respect to an inner space of the chamber. The supporting member further includes a tubular main portion, a diameter extending portion arranged at an end portion thereof to which the susceptor is faced, and one or more continuous round portions arranged between the main portion and the diameter extending portion, when viewed by an outer profile of a longitudinal section of the supporting member.

The diameter extending portion means a portion at which an outer diameter is larger than that of the main portion.

A phrase "one or more continuous round portions arranged between the main portion and the diameter extending portion" means that at least one round portion is arranged between the main portion and the diameter extending portion. The number of the round portions is defined by the number of centers of curvature. If the center of curvature is one, the round portion corresponding to the center of curvature is also one. If the round portions are two, there are centers of curvature corresponding to respective round portions.

Moreover, the present invention includes a case such that a plurality of round portions are arranged continuously. Here, a term "a plurality of round portions" means a plurality of round portions having different centers of curvature. Moreover, a phrase "a plurality of round portions are arranged continuously" means that a plurality of round portions are arranged continuously without arranging a portion such as line portion, straight portion and step portion other than the round portion between round portions. In this case, respective curvature radii of the round portions may be different, and also they may be the same.

It should be noted that a case such that another round portions is arranged between the diameter extending portion and the susceptor is not excluded.

BRIEF DESCRIPTION OF THE DRAWING

For a better understanding of the invention, reference is made to the attached drawings, wherein.

DETAILED DESCRIPTION OF THE INVENTION

Figure 1:
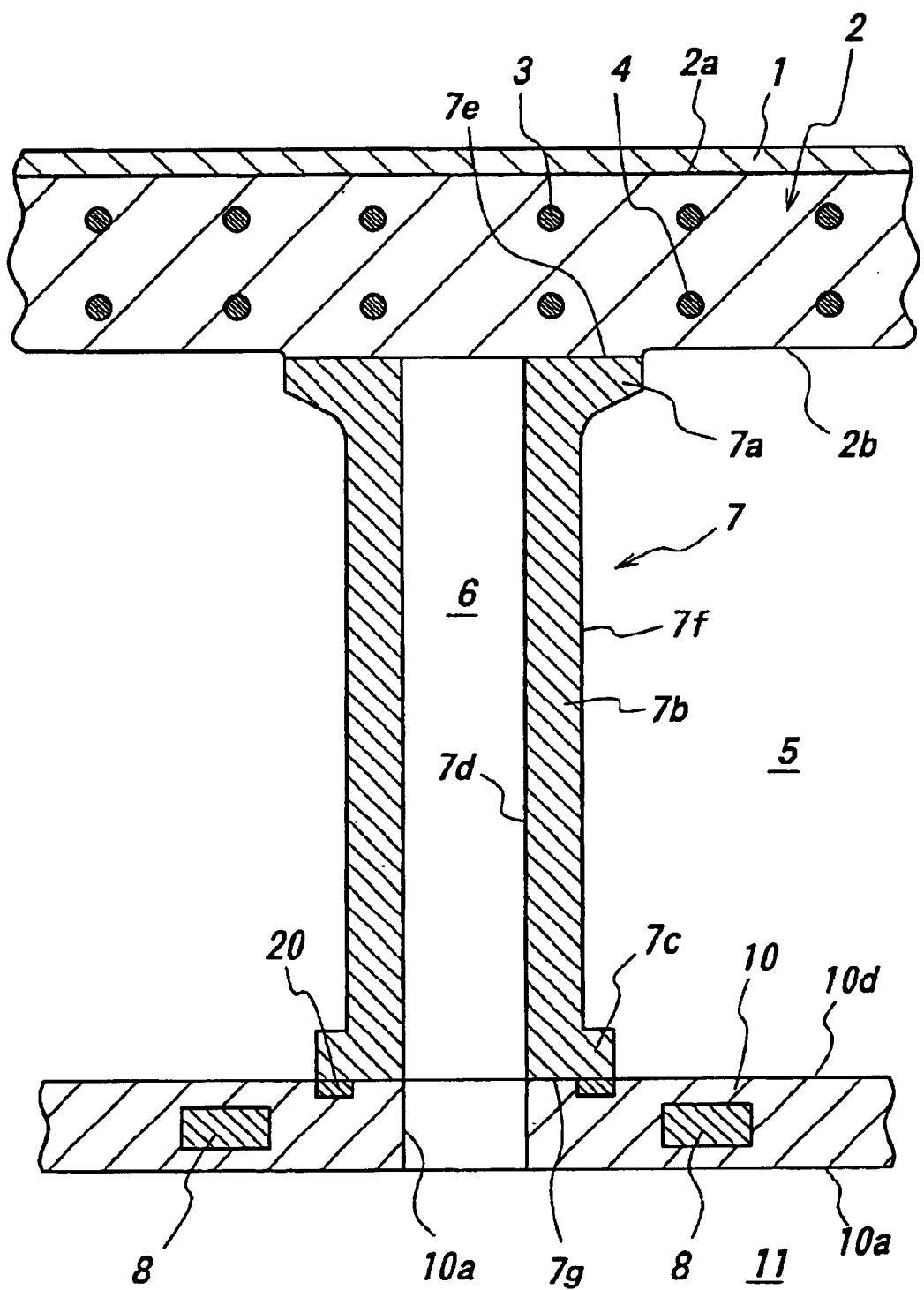
FIG. 1 is a cross sectional view showing one embodiment of a susceptor supporting construction according to the invention.

The present invention will be explained with reference to embodiments shown in FIGS. 1–3. A diameter extending portion 7a is arranged at one end of a tubular supporting member 7, and a diameter extending portion 7c is arranged at the other end thereof. A connecting surface (end surface) 7e of the diameter extending portion 7a is connected to a connecting surface (rear surface) 2b of a susceptor 2. An end surface 7g of the diameter extending portion 7c is connected to an inner wall surface 10d of a chamber 10. An inner space 6 of the supporting member 7 is communicated with an opening 10a of the chamber 10. A portion between the supporting member 7 and the chamber 10 is sealed in an airtight manner by means of an O-ring (sealing member) 20. A numeral 7d is an inner profile of a longitudinal section of the supporting member 7, and numeral 7f is an outer profile thereof.

A connecting method between the supporting member and the susceptor is not particularly limited. For example, it is possible to connect them by means of a brazing material or to connect them in a solid phase or a solid-liquid phase as shown in JP-A-8-73280. An uppermost temperature of a heating surface 2a of the susceptor 2 reaches to. for example, not less than 400° C. sometimes not less than 600° C. and not more than 1200° C.

An outer space 11 of the chamber 10, the opening 10a of the chamber 10 and the inner space 6 of the supporting member 7 are communicated, while they are apart from an inner space 5 of the chamber 10. A portion near the sealing member 20 is cooled by arranging a cooling flange 8 in the chamber 10, and a temperature near the sealing member 20 is controlled to be not more than 230° C.

The supporting member 7 comprises a tubular main portion 7b, the diameter extending portion 7a of a susceptor side and the diameter extending portion 7c of a chamber side. The present invention relates to the outer profile 7f of a longitudinal section of the supporting member 7 existing from the main portion 7b to the diameter extending portion 7a.

Figure 2:
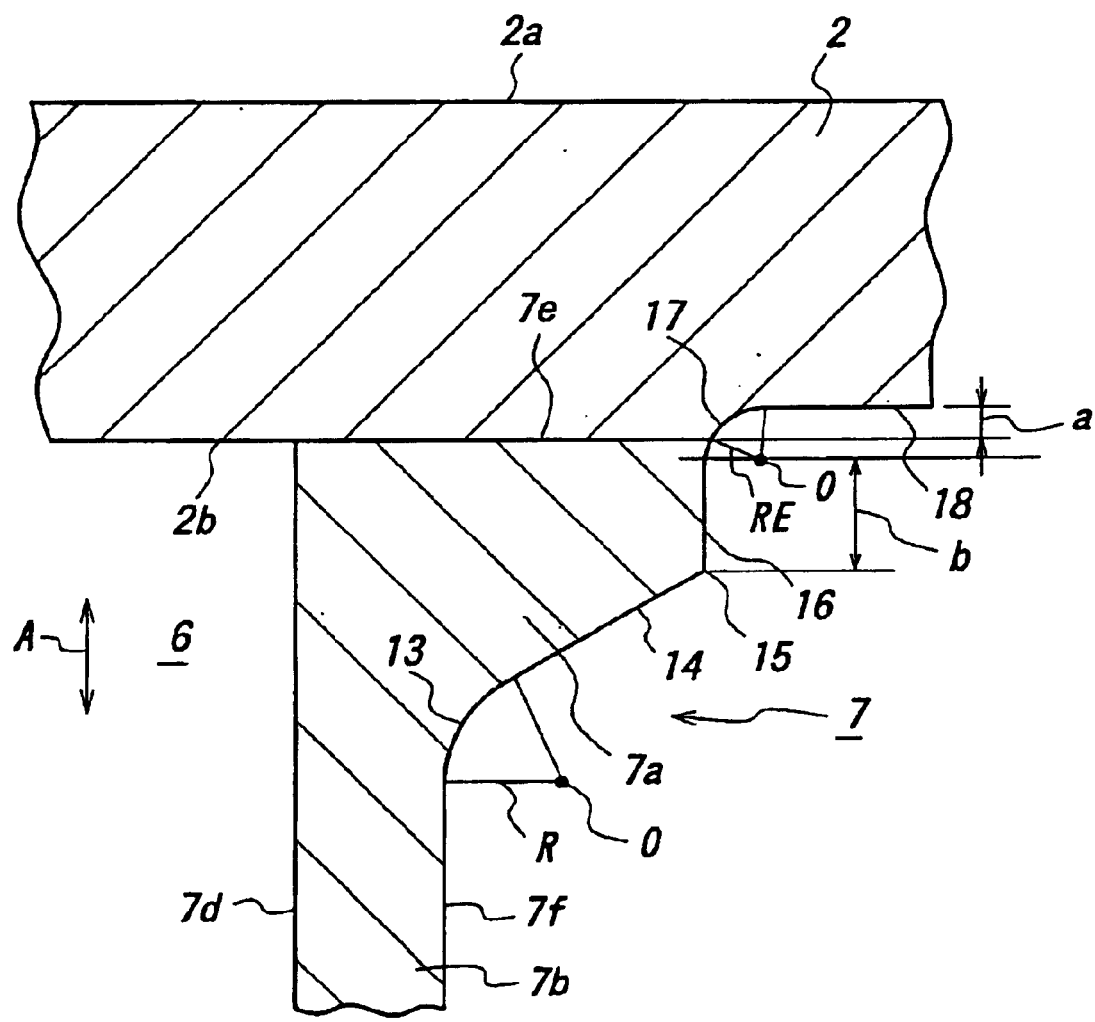
FIG. 2 is an enlarged cross sectional view illustrating a connection portion between a supporting member 7 and a susceptor 2 in the construction shown in FIG. 1.
Figure 3:
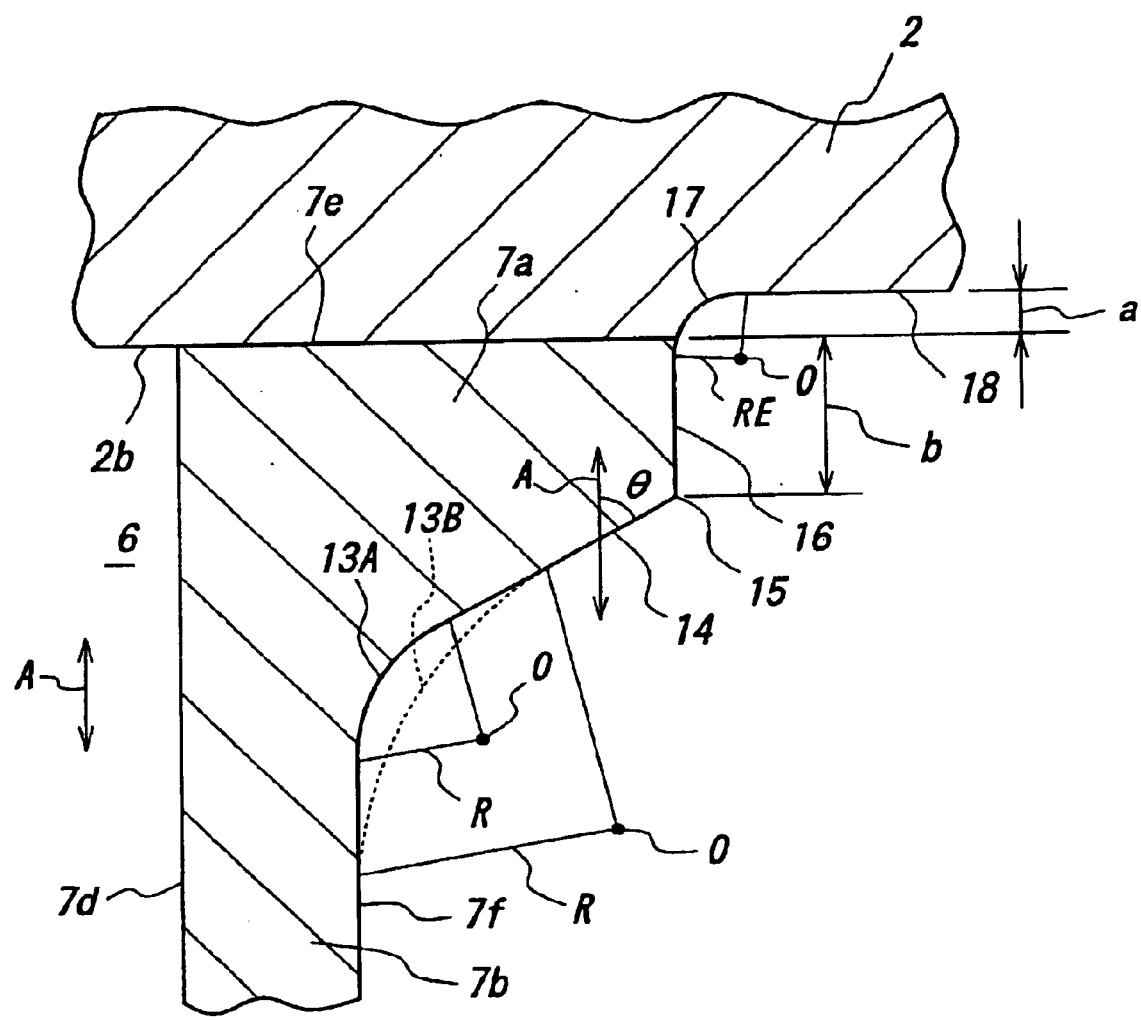
FIG. 3 is a further enlarged cross sectional view depicting one part of the construction shown in FIG. 2.

In the present invention, as shown in FIGS. 2 and 3, an outer profile of the main portion is substantially straight and an outer side surface 16 of the diameter extending portion 7a is also substantially straight, while they are substantially parallel to a center axis A of the supporting member 7. When viewing the outer profile of the supporting member 7, it is understood that a round portion 13 (13A and 13B), a straight portion 14, an angle portion 15, the outer side surface 16 of the diameter extending portion 7a, a round portion 17 and a rear surface 18 of the susceptor are arranged in this order from the main portion 7b to the susceptor 2. In this embodiment, a symbol R shows a curvature radius of the round portion 13 (13A and 13B), and a symbol RE shows a curvature radius of the round portion 17.

During investigations of a construction for reducing a stress concentration near the diameter extending portion, the present inventors found that specific shapes shown in, for example. FIGS. 1–3 are particularly effective for this purpose. That is, in the case that one round portion 13(13A and 13B) is arranged between the main portion 7b and the diameter extending portion 7a, it was found that a stress concentration of the supporting member could be effectively reduced and a temperature of the diameter extending portion 7c of the chamber 10 side can be suppressed most effectively.

The present inventors performed various detailed investigations for the other plural shapes by means of a simulation of inner stress of the supporting member. For example, a supporting member 7A having a shape shown in FIG. 5 was investigated. In this example, a first round portion 21, a straight portion 22. an angle portion 23, a straight portion 24, a second round portion 25, a straight portion 26 and the angle portion 15 are arranged from the main portion 7f and the outer side surface 16 of the diameter extending portion 7a. Symbols R1 and R2 show respective curvature radii of the first round portion 21 and the second round portion 25. The present inventors tried to reduce an inner stress of the supporting member by arranging a plurality of round portions between the main portion 7f and the diameter extending portion 7a as mentioned above and by varying a curvature radius of respective round portions variously. However, from a result of actual simulation, it was found that an inner stress maximum value of the supporting member was extraordinarily decreased by arranging a single round portion between the main portion 7f and the diameter extending portion 7a as compared with the case such that a number of the round portions were arranged so as to disperse a stress. In this manner, the present invention has been achieved.

A curvature radius of the round portion 13 is not limited, but it is preferred from a point of view of reducing an inner stress of the supporting member to set this curvature radius to not less than 3 mm, more preferably not less than 5 mm and most preferably not less than 10 mm.

Moreover, there is a tendency such that, if a curvature radius of the round portion is increased, a heat amount conducted through the supporting member is also increased. For example, in the embodiment shown in FIG. 3, a curvature radius R of the round portion 13A shown by a solid line is relatively small, and a curvature radius R of the round portion 13B shown by a dotted line is relatively large. From a point of view of reducing an inner stress of the supporting member 7, the round portion 13B having a large curvature radius is preferred. However, if a curvature radius of the round portion is large, there is a tendency such that a cross sectional area of the supporting member becomes larger correspondingly and a temperature near the diameter extending portion 7c (refer to FIG. 1) is increased. From a point of view of decreasing a temperature near the chamber side end portion of the supporting member, it is preferred to set a curvature radius of the round portion 13 to not more than 30 mm, more preferably not more than 25 mm and most preferably not more than 20 mm. A most preferable range of a curvature radius of the round portion 13 is 14–16 mm.

In the preferred embodiment of the present invention, as shown in, for examples FIG. 3, a straight portion 14 extending in a direction crossing to the center axis A of the supporting member 7 is arranged between the diameter extending portion 7a and the round portion 13A (13B) when viewing the outer profile 7f of a longitudinal section of the supporting member 7. By arranging the straight portion 14, it is possible to make a thickness of the diameter extending portion 7a sufficiently larger or to make a thickness of the main portion 7b sufficiently smaller. For example, if the straight portion is not arranged in the embodiment shown in FIG. 3, a thickness of the diameter extending portion 7a becomes extraordinarily small.

An inclination angle θ of the straight portion 14 with respect to the center axis A is not limited, but it is preferred from a point of view mentioned above to set an inclination angle θ to 45–90 degrees.

Moreover, in the preferred embodiment, another round portion 17 is arranged between the diameter extending portion 7a and the surface 18 of the susceptor 2 when viewing the outer profile 7f of a longitudinal section of the supporting member 7.

In this case, as shown in FIGS. 2 and 3, it is preferred to arrange at least a part of another round portion 17 to the susceptor. In other words, it is preferred to form a step (a) between the surface 18 of the susceptor 2 and the connecting surface 7e. Hereby, it is possible to reduce a stress concentration of the connecting portion to the fullest extent.

Figure 4:
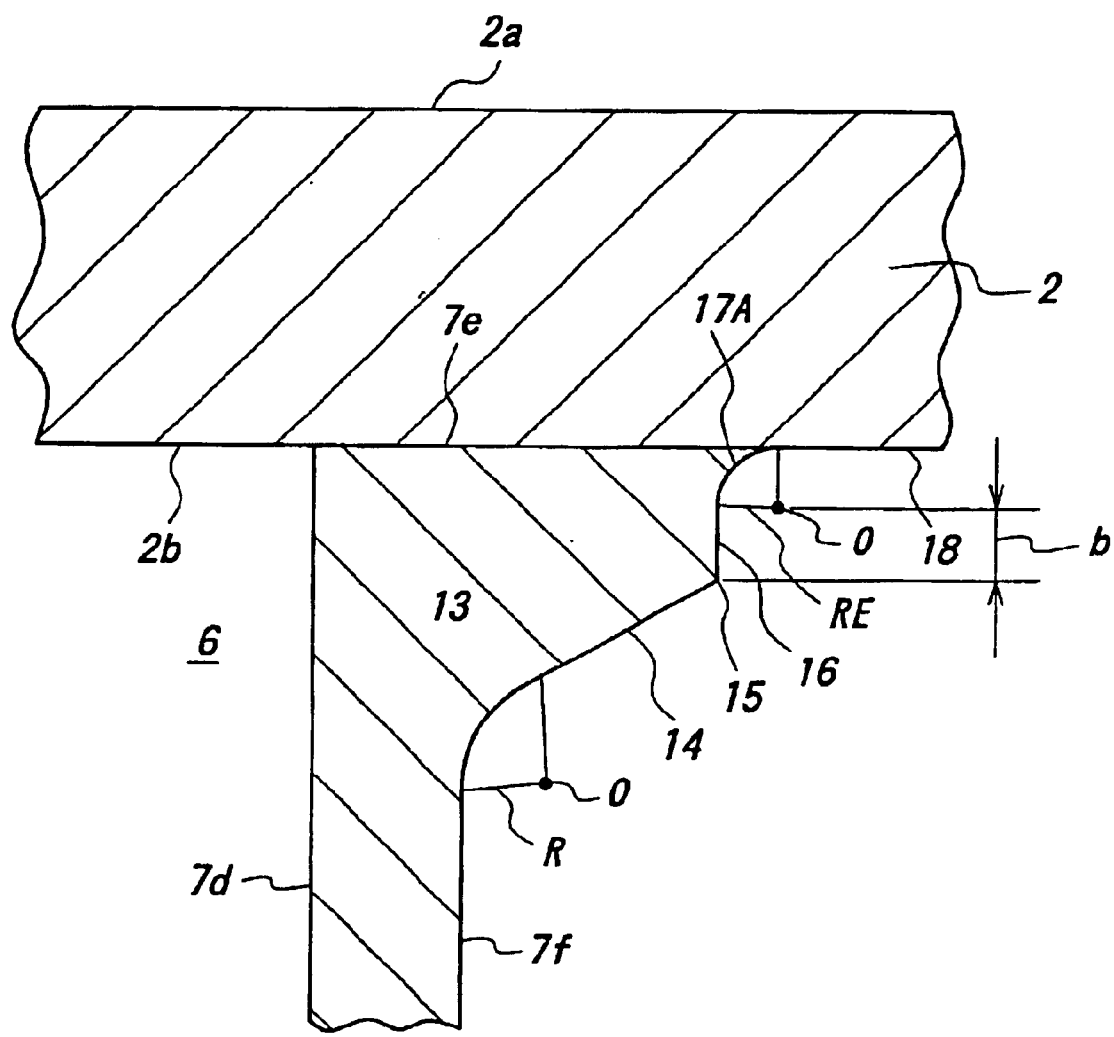
FIG. 4 is a cross sectional view showing another embodiment of a susceptor supporting construction according to the invention.

In the present invention, as shown in FIG. 4, it is possible to arrange no step portion between the connecting surface 7e and the surface (exposed surface) 18 of the susceptor 2. In this case, if a round portion 17A is arranged, a thickness of the supporting member at the round portion 17A becomes extraordinarily small and irregular shape. Therefore, a stress is easily concentrated near the round portion 17A or a film peeling easily occurs from the round portion 17A.

The curvature radius RE of another round portion 17 (17A) is preferably set from a point of view of minimizing a stress at the connecting portion to not less than 1 mm more preferably not less than 2 mm.

The step (a) is not limited, but it is preferred from a point of view of reducing a stress at the connecting portion to set the step (a) to not less than 1 mm.

In the preferred embodiment, the outer profile 16 of the diameter extending portion 7a is extended in a direction substantially parallel to the center axis A of the supporting member 7. Increasing a length (b) of the outer profile or outer surface 16 means increasing a thickness of the diameter extending portion 7a. In this case, it was found that a stress near the diameter extending portion could be further reduced by increasing the length (b). From this point of view, it is preferred to set the length (b) to not less than 2 mm, more preferably not less than 5 mm.

However, if the length (b) is made larger, there is a tendency such that a heat conducted to the chamber through the supporting member 7 becomes larger and a temperature of the chamber side end portion of the supporting member is increased and sometimes exceeds a specified temperature (for example 200° C.). Therefore, it is preferred to limit the length (b) to not more than 10 mm.

Materials of the susceptor and the supporting member are not limited, but it is preferred to use ceramics. Moreover, it is preferred to use ceramics having a corrosion resistance with respect to a halogen-series corrosive gas particularly such as aluminum nitride or dense alumina, and further preferred to use aluminum nitride ceramics or alumina having a relative density of not less than 95%.

The ceramic susceptor is heated by some kind of heating sources. In this case, the heating sources are not limited, and use is made of the susceptor heated by an external heating source (for example infrared lamp) and the susceptor heated by an inner heating source (for example heater embedded in susceptor). In the susceptor, it is possible to embed functional parts such as resistant heater, electrode for electrostatic chuck, electrode for plasma generation and so on.

A material of the sealing member is not limited, but it is preferred to use O-ring seal and metal-ring seal.

Experiment

EXAMPLES OF INVENTION 1–5

The susceptor supporting constructions explained with reference to FIGS. 1–3 were manufactured. As the susceptor 2, use was made of a disc made of aluminum nitride sintered body having a diameter of 330 mm and a thickness of 15 mm. The supporting member 7 was made of a dense aluminum nitride sintered body. The supporting member 7 and the susceptor 2 were connected in solid phase as described in JP-A-8-73280. The supporting member 7 and the chamber 10 were connected by means of screws. The O-ring 12 was made of fluorine rubber.

An overall length of the supporting member 7 was 180 mm and an inner diameter of the supporting member 7 was 38 mm. A thickness of the main portion 7b was 8 mm and a thickness of the diameter extending portion 7a was 8 mm. A curvature radius RE of the round portion 17 was 3 mm, the step (a) was 2 mm, and a length (b) of the straight portion 16 was 15 mm. Curvature radii R of the round portions 13 were shown in the following Table 1.

Under such a condition, assuming that a temperature of the mount surface 2a of the susceptor 2 was heated to about 600° C., a simulation was performed. In this case, an inner stress of the supporting member 7 was calculated along an overall portion thereof so as to obtain a maximum stress. In addition, a temperature of the chamber side end portion 7c of the supporting member 7 was obtained.

TABLE 1

| | Curvature radius R of round portion 13 (mm) | Maximum stress (kgf/mm$^2$) | Temperature of diameter extending portion 7c (° C.) |
|---|---|---|---|
| Example of invention 1 | 5 | 4.0 | 187 |
| Example of invention 2 | 10 | 3.0 | 192 |
| Example of invention 3 | 15 | 2.6 | 196 |

TABLE 1-continued

| | Curvature radius R of round portion 13 (mm) | Maximum stress (kgf/mm$^2$) | Temperature of diameter extending portion 7c (° C.) |
|---|---|---|---|
| Example of invention 4 | 20 | 2.3 | 200 |
| Example of invention 5 | 25 | 2.1 | 203 |

COMPARATIVE EXAMPLE 1

Figure 5:
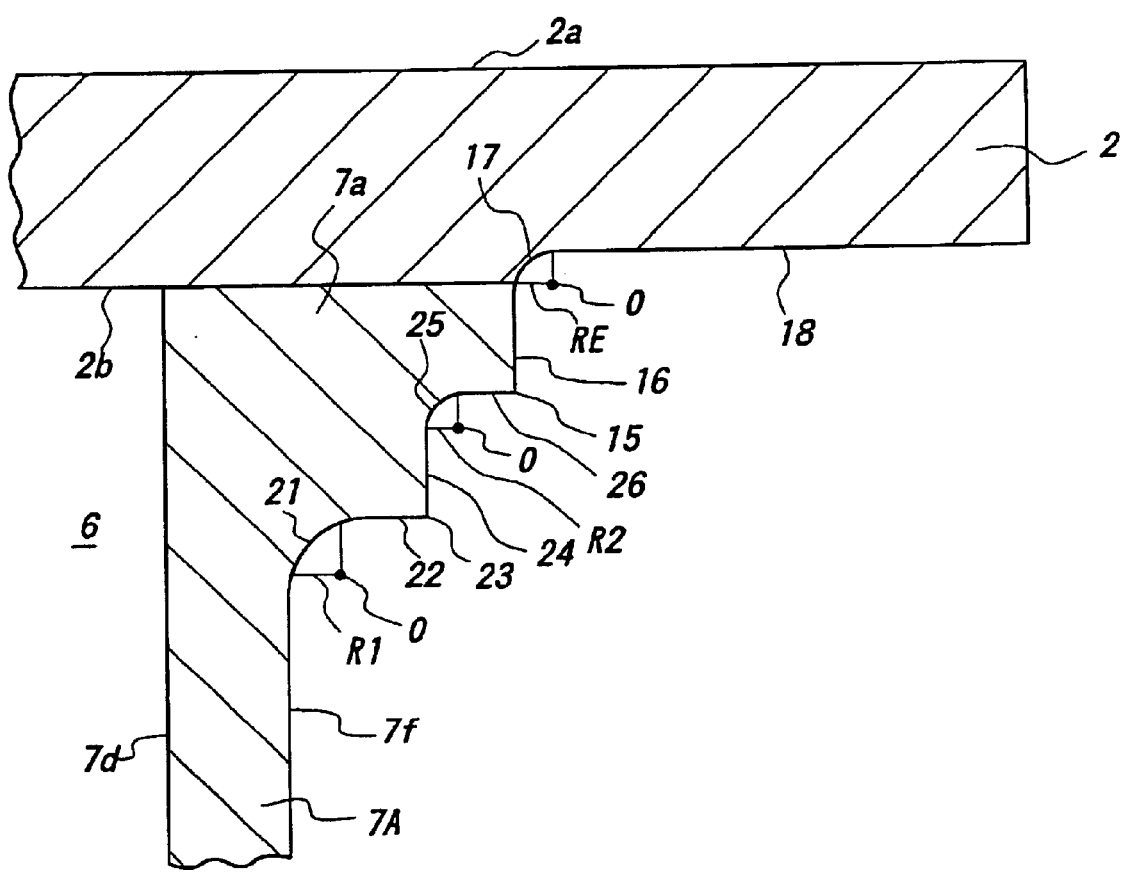
FIG. 5 is a cross sectional view illustrating one embodiment of a susceptor supporting construction without a scope of the invention.
Figure 6:
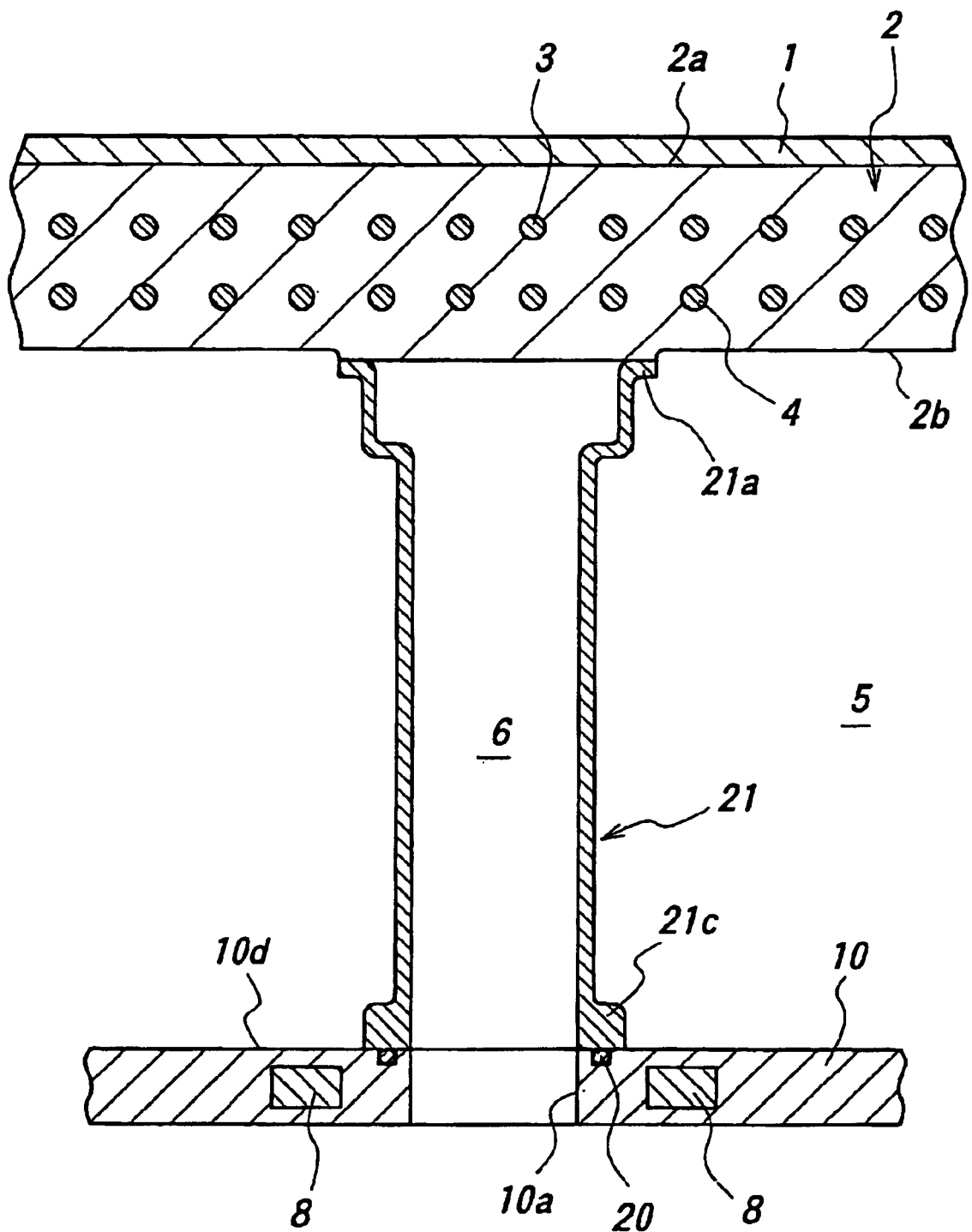
FIG. 6 is a cross sectional view depicting another embodiment of a susceptor supporting construction without a scope of the invention.

The susceptor supporting construction of the comparative example 1 shown in FIG. 5 was manufactured. The construction was basically same as that of the example of invention 1, but round portions 21, 25, straight portions 22, 24, 26, and angle portions 23, 15 were arranged. A curvature radius R1 of the round portion 21 was 5 mm and a curvature radius R2 of the round portion 25 was 3 mm. As is the same as the example of invention 1, a maximum stress and a temperature of the chamber side end portion 7c of the supporting member 7 were obtained. As a result, the maximum stress was 3.2 kgf/mm$^2$ and the temperature of the chamber side end portion 7c was 180° C.

EXAMPLES OF INVENTION 6, 7

In the example of invention 6, the same construction as that of the example of invention 1 was manufactured. However, a curvature radius RE of the round portion 17 was 3 mm, the step (a) was 2 mm, a length (b) of the straight portion 16 was 5 mm, and a curvature radius R of the round portion 13 was 15 mm. As a result, the maximum stress was 2.6 kgf/mm$^2$.

In the example of invention 7, the straight portion 16 was excluded from the construction of the example of invention 6. As a result, the maximum stress was 2.7 kgf/mm$^2$.

EXAMPLES OF INVENTION 8, 9

The same constructions as that of the example of invention 1 were constructed. However, heights (b) of the straight portions 16 were varied as shown in the following Table 2. With respect to respective constructions, a maximum stress and a temperature of the end portion 7c were calculated. The results were shown in the following Table 2.

TABLE 2

| | Height (b) of straight portion 16 (mm) | Maximum stress (kgf/mm$^2$) | Temperature of diameter extending portion 7c (° C.) |
|---|---|---|---|
| Example of invention 8 | 2 | 2.58 | 192 |
| Example of invention 9 | 12 | 2.48 | 207 |

As explained above, according to the invention, it is possible to suppress a heat conducted from the susceptor to the support member and to reduce a stress concentrated to the susceptor when the susceptor becomes high temperatures.

What is claimed is:

1. A susceptor supporting construction comprising a susceptor for heating a member to be processed and a supporting member, in which an inner space is arranged, connected to one another, a chamber having an opening connected to the supporting member, the opening of the chamber being in communication with the inner space of the supporting member, and the inner space of the supporting member being sealed in an airtight manner with respect to an inner space of the chamber, said supporting member further comprising a first wall portion defining a tubular main portion, a second wall portion defining a diameter extending portion arranged at an end portion thereof, the entirety of said second wall portion being joined to the susceptor, and one or more continuous round portions arranged between the main portion and the diameter extending portion, when viewed by an outer profile of a longitudinal section of the supporting member, wherein a portion of an outer surface of said second wall portion is substantially parallel to a portion of an outer surface of said first wall portion, the radial thickness of said first wall portion is less than the radial thickness of said second wall portion, and an inner surface of the supporting member has a substantially constant diameter along the entire length of the supporting member and wherein said first wall portion, said second wall portion and said one or more continuous round portions define a one-piece structure.

2. The susceptor supporting construction according to claim 1, wherein a curvature radius of the round portion is not less than 3 mm and not more than 30 mm.

3. The susceptor supporting construction according to claim 1, wherein a straight portion extending in a direction crossing to a center axis of the supporting member is arranged between the diameter extending portion and the round portion, when viewed by an outer profile of a longitudinal section of the supporting member.

4. The susceptor supporting construction according to claim 1, wherein an another round portion is arranged between the diameter extending portion and a surface of the susceptor, when viewed by an outer profile of a longitudinal section of the supporting member.

5. The susceptor supporting construction according to claim 4, wherein at least a part of the another round portion is formed to the susceptor.

6. The susceptor supporting construction according to claim 1, wherein an outer side surface of the diameter extending portion is extended in a direction substantially parallel to a center axis of the supporting member, when viewed by an outer profile of a longitudinal section of the supporting member.

7. The susceptor supporting construction according to claim 1, wherein a material of the susceptor or the supporting member is ceramics.

8. The susceptor supporting construction according to claim 1, wherein said supporting member is an integral body including said first wall portion, said second wall portion and said one or more continuous round portions.

* * * * *